United States Patent

[11] 3,634,872

[72] Inventor Junichi Umeda
Kodaira, Japan
[21] Appl. No. 69,747
[22] Filed Sept. 4, 1970
[45] Patented Jan. 11, 1972
[73] Assignee Hitachi, Ltd.
Tokyo, Japan
[32] Priorities Sept. 5, 1969
[33] Japan
[31] 44/70002;
Sept. 16, 1969, Japan, No. 44/72742

[54] LIGHT-EMITTING DIODE WITH BUILT-IN DRIFT FIELD
22 Claims, 11 Drawing Figs.

[52] U.S. Cl. .......... 317/234 R, 313/108 D, 317/234 Q, 317/234 UA, 317/235 N, 317/235 AN, 317/235 AP
[51] Int. Cl. .......... H01l 3/20, H01l 5/00, H01l 11/12, H05b 33/00
[50] Field of Search .......... 317/235 N, 235 AN; 313/108 D

[56] References Cited

UNITED STATES PATENTS

| | | | |
|---|---|---|---|
| 3,132,057 | 5/1964 | Greenberg | 148/33 |
| 3,333,135 | 7/1967 | Galginaitis | 313/108 D |
| 3,351,827 | 11/1967 | Newman | 317/235 |
| 3,398,310 | 8/1968 | Larsen et al. | 313/108 D |
| 3,419,742 | 12/1968 | Herzog | 313/108 D |
| 3,436,625 | 4/1969 | Newman | 317/237 |
| 3,456,209 | 7/1969 | Diemer | 331/94.5 |
| 3,458,782 | 7/1969 | Buck et al. | 317/235 |
| 3,501,679 | 3/1970 | Yonezu et al. | 317/234 |
| 3,537,029 | 10/1970 | Kressel et al. | 317/234 X |
| 3,560,275 | 2/1971 | Kressel et al. | 148/175 |

OTHER REFERENCES

Cusano et al., Applied Physics Letters Vol. 5, No. 7 (Oct. 1964), pp. 144– 145, " Recombination Scheme and Intrinsic Gap Variation in $GaAs_{1-x}P_x$ Semiconductors . . ."

*Primary Examiner*—John W. Huckert
*Assistant Examiner*—William D. Larkins
*Attorney*—Craig, Antonelli & Hill

ABSTRACT: An injection electroluminescent semiconductor device having a light emitting conductivity-type layer with a PN-junction. wherein the distribution of effective majority impurity concentration decreases, or when a mixed crystal semiconductor material is used the component having a greater forbidden band width is reduced, with the increase of the distance from the PN junction. This construction causes the formation of an internal electric field which keeps injected minority carriers away from the PN-junction. thereby increasing the penetration length of injected minority carriers and improving the quantum efficiency of light emission.

INVENTOR

JUNICHI UMEDA

BY

Craig, Antonelli, Stewart & Hill

ATTORNEYS

INVENTOR.
JUNICHI UMEDA
BY
Craig, Antonelli, Stewart & Hill
ATTORNEYS

LIGHT-EMITTING DIODE WITH BUILT-IN DRIFT FIELD

FIELD OF THE INVENTION

The present invention relates to an injection electroluminescent semiconductor device having an improved quantum efficiency of light emission.

BACKGROUND OF THE INVENTION

A typical injection electroluminescent semiconductor device used in the prior art comprises an electroluminescent diode having a PN-junction. The electroluminescent diode having a PN-junction is an element which emits light accompanying the recombination of minority carriers injected over the junction under a forward bias.

It has been known in the art that high efficiency luminescence takes place in a P-type layer of semiconductor crystals of group II–V compounds of the periodic table, such as GaAs, GaAsP, GaAlAs and GaP. According to studies on voltage-luminescence efficiency characteristics, the luminescence is proportional to the diffusion current component (hereinafter referred to as $J_{dn}$ in the present specification) because of electrons injected into the P-type layer. In the above-mentioned electroluminescent semiconductor materials, however, their forbidden band is wide and the purity of material is insufficient, so that the major part of a forward current is a recombination-generation current component which emits no light (hereinafter referred to as $J_{rg}$ in the present specification) in a depletion layer, as noted from the studies on voltage-current characteristics. By means of a photoluminescence test, high quantum efficiency of light emission, such as about 20 percent, is obtained. However, when such a device is operated as a diode, the quantum efficiency of light emission is only 2 percent.

The main reasons why the efficiency is lowered in the case of operating these electroluminescence semiconductor materials as a diode are as follows:

1. $J_{dn}/J_{rg}<<1$
2. Lattice defects of the bulk crystal are increased in the neighborhood of the junction and become nonluminescent recombination centers.

However, in conventional PN-junctions, for instance, in those formed by diffusing Zn into an N-type layer constituted by a semiconductor material of group III–V of the periodic table, the Zn concentration in the P-type layer is higher with increasing distance from the junction. Therefore, an internal field which draws back electrons injected into the P-type layer is formed, further lowering the quantum efficiency of light emission. In fact, group III–V semiconductor devices fabricated by the usual grown junction method, in spite of many lattice defects in the neighborhood of the junction, show higher quantum efficiencies of light emission than those of semiconductor devices fabricated by the diffusion method, owing to a better uniformity of impurity concentration.

Moreover, using mixed crystal injection electroluminescent semiconductor devices, one can choose a band structure of crystals and a forbidden band width by varying the composition of the alloys. As a consequence, such devices are widely utilized for visible luminescence, and in this case, in order to avoid the internal absorption of light emitted around the PN-junction, they are so designed that the forbidden band is wider at the window side with respect to the junction. However, in this structure, an internal electric field which draws back electrons injected into the P-type layer toward the junction is formed, lowering the quantum efficiency of light emission.

As discussed above, in the conventional electroluminescent semiconductor devices, the quantum efficiency of light emission is generally very low and effective means for improving the quantum efficiency of light emission has not yet been reported in the literature.

SUMMARY OF THE INVENTION

One of the objects of the present invention is to provide an injection electroluminescent semiconductor device having a high quantum efficiency of light emission. More particularly, the invention relates toward providing an improved injection electroluminescent semiconductor device by increasing the ratio of the diffusion current component of minority carriers to the total current when a PN-junction semiconductor is biased in the forward direction, as well as by increasing the ratio of the number of minority carriers which are further than a certain distance from the junction to the total number of injected minority carriers.

Another object of this invention is to provide an injection electroluminescent semiconductor device having an improved quantum efficiency of light emission, in which an electric field to keep injected minority carriers away from the junction is formed at least partially between the surface of the PN-junction and a surface at the end of the penetration length of minority carriers under a forward bias in at least one of the light-emitting conductivity-type layers.

Still another object of the present invention is to provide an injection electroluminescent semiconductor device in which a uniform distribution of the current is obtained throughout the PN-junction.

In accordance with the present invention, the thickness of at least one of the light-emitting conductivity-type layers constituting a PN-junction is larger than the penetration length of minority carriers injected under a forward bias, and the effective majority impurity concentration, namely the absolute value of the difference between the acceptor concentration and the donor concentration, in a light-emitting conductivity-type layer at least partially between the surface of the PN-junction and a surface at the end of the penetration length of minority carriers, decreases with increasing distance from the junction. Moreover, in an injection electroluminescent semiconductor device using a mixed crystal semiconductor material, the construction thereof is designed so as to make it possible to obtain the said electroluminescence through the conductivity-type layer which emits no electroluminescence, and at least at a portion of the region up to the penetration length of injected carriers the content of the component having a wider forbidden band among the components of the mixed crystal decreases with an increasing distance from the said PN-junction.

Furthermore, in accordance with this invention, a uniform distribution of current through the PN-junction is obtained by again increasing the effective majority impurity concentration, in the case where an ohmic contact is provided on a surface, which is on the opposite side to the PN-junction, of the conductivity-type layer having the gradually decreasing effective majority impurity concentration distribution with increasing distance from the said PN-junction.

This invention has resulted from theoretical studies and experiments conducted on the basis of the knowledge that the foregoing two reasons cause the decrease in quantum efficiency of light emission in injection electroluminescent semiconductor devices. In the following explanation, only the case where the electrons injected into the P-type layer make a transition to the valence band will be discussed. However, the same type of reasoning can be applied to the case where light is emitted by holes injected into the N-type layer. In the following discussion, the principles of this invention will be explained at first with respect to an injection electroluminescent semiconductor device consisting of a uniform semiconductor material, and then with respect to that of a nonuniform semiconductor material.

Making the boundary between the P-type layer and the depletion layer the origin of a coordinant while taking an X-axis on which the direction toward the P-type layer represents the positive values and, for brevity, disregarding entirely, with respect to the effective acceptor concentration A, electron and hole concentrations in the conduction band and in the valence band, respectively, when the Fermi level falls at the energy level of predominant recombination centers, assume that the intensity of internal electric field E in the P-type layer measured in a positive direction is constant, the relationship of $n >> n_i^2/A$ is established when $n$ represents the electron concentration whereas $n_i$ is the electron concentration for an intrinsic semiconductor, that all of the acceptor levels are filled with electrons, and that only a small current region is considered. Using this base and assuming that $q$ represents the absolute value of electron charge, $k$ the Boltzmann constant, $T$ the absolute temperature, $D_n$ the diffusion constant of electrons in a P-type layer, $L_n$ the diffusion length of electrons in a P-type layer and $V$ the applied potential difference in a forward direction, under the following condition:

$$A = A_0 \exp\left(\frac{qEL_n}{kT}\frac{X}{L_n}\right) \qquad (1)$$

the expression given below can be obtained by an approximate calculation starting from the Maxwell equations:

$$(J_{dn})_{x=0} = \frac{qD_n n_i^2}{A_0} \exp\left(\frac{qV}{kT}\right) \times \left(\frac{qE}{2kT} - \sqrt{\left(\frac{qE}{2kT}\right)^2 + \frac{1}{L_n^2}}\right) \qquad (2)$$

Hence, the ratio $M_E$ between $(J_{dn})_{x=0}$ for $E=o$ and that for $E \neq o$ for $a$ given $V$ can be approximately expressed as follows:

$$M_E = \sqrt{\left(\frac{qEL_n}{2kT}\right)^2 + 1} - \frac{qEL_n}{2kT} \qquad (3)$$

The equation (3) implies that when $E<O$, $M_E>1$ and the value of $M_E$ will be larger as $|E|$ increases.

From the equation (1), it is clear that for a junction fabricated by ordinary diffusion methods, $M_E<1$, as $E>O$ and in the case of the grown junction, $M_E$ is close to 1 as $E \gtrsim O$. On the contrary, in the construction where the effective acceptor concentration decreases with increasing distance from the junction toward the P-type layer, compared with the case without a concentration gradient, for the same bias and hence the same $J_{rg}$, the diffusion current of electrons will be increases by a factor of $M_E$.

The quantum efficiency of light emission of a diode can be expressed by the following equation:

$$\eta = b\,(J_{dn}/(J_{dn}+J_{rg}) \qquad (4)$$

where $b$ is a constant which depends upon the bulk crystal.

However, since $J_{dn} << J_{rg}$, this equation can be expressed as follows and the value of $\eta$ will also be $M_E$ times as large as $(\eta)_{E=o}$:

$$\frac{\eta}{(\eta)_{E=O}} \approx \frac{J_{dn}}{(J_{dn})_{E=O}} = M_E \qquad (5)$$

Although when $E<O$, $M_E>1$, it is preferable that the value of $M_E$ be sufficiently larger than 1, i.e., the relationship which must be fulfilled can be expressed by $(-qEL_n/kT) \geq 1$, in order to achieve the results of the present invention. Thus, from the equation (1), it can be noted that the effect of this invention is remarkable when there exists at least partially an impurity concentration gradient by means of which the effective majority impurity concentration decreases approximately to $1/e$ or at least less than ½ for every diffusion length measured in the direction perpendicular to the PN-junction in at least one of the light-emitting conductivity-type layers. In other words, as to crystals, in which the diffusion length of injected minority carriers is approximately 2 microns, such as *GaAs*, $GaAs_{1-x}P_x(0<x<0.45)$, $Ga_{1-x}Al_xAs(0<x<0.45)$ or GaP containing oxygen atoms in an amount of less than $10^{16}$ cm.$^{-3}$ as impurity, the impurity concentration gradient of the injection electroluminescent semiconductor device according to the present invention should be such that the effective majority impurity concentration decreases as an exponential function to approximately less than 1/1.4 for every 1 micron separation from the PN-junction. In the case where the concentration gradient shows a linear variation, it should be larger than $10^{20}$ cm.$^{-4}$.

On the other hand, when crystals are used which have a diffusion length of about 20 microns, for example, crystals of GaP containing oxygen atoms as impurity in a concentration of more than $10^{16}$ cm.$^{-3}$, a remarkable effect can be obtained even with such a small impurity concentration gradient whereby the effective majority impurity concentration decreases approximately to 1/1.4 for every 10 microns of separation from the PN-junction.

With respect to the aforementioned concentration gradient which varies as an exponential function as well as the one which varies linearly in correspondence to the distance from the junction, a high efficiency light emission cannot be expected unless the impurity concentration is at least $10^{16}$ cm.$^{-3}$.

The concentration distribution of injected electrons can be expressed approximately as follows:

$$n = \frac{n_i^2}{A_0} \exp\left(\frac{qV}{kT}\right) \exp\left\{-\left(\sqrt{\left(\frac{qE}{2kT}\right)^2 + \frac{1}{L_n^2}} + \frac{qE}{2kT}\right) \times\right\} \qquad (6)$$

As compared with the case for $E=O$, the effective penetration length of electrons injected into the P-type layer will be $M_E$ times, and $M_E>1$ when $E<O$ so that the ratio of the number of electrons, present in the portion that is farther than a certain distance from the junction, to the total number of electrons injected into the P-type layer will be increased. Hence, it can be expected, as a whole, that the quantum efficiency of light emission is improved more markedly than that represented by the equation (5) by reducing the influence of lattice defects near the junction.

In an injection electroluminescent semiconductor device, the electrode located on the side from which light is emitted should be constructed as small as possible and should have a construction which will not disturb the penetration of light. However, in the case where light generated by the injection electroluminescent semiconductor device is taken out through the light-emitting conductivity-type layer, and where the effective majority impurity concentration decreases with increasing distance from the junction, the specific resistance will be increased in the vicinity of the electrode and the spread resistance from the electrode will also be increased. Therefore, when the electrode is smaller than the PN-junction, there occurs the possibility that the uniform light emission from the overall surface of the PN-junction will become difficult. In such a case, the above-mentioned difficulty can be eliminated by employing the construction wherein the effective majority impurity concentration increases again near the surface, which is opposite to the PN-junction in the conductivity-type layer which emits the major part of light.

A type of semiconductor device, called hyperabrupt varactor diodes, which have a construction similar to that of the present invention, are known in the art. In this type of diode, the design if such so as to increase the variation of the junction capacity by providing an effective majority impurity concentration gradient in the region where the depletion layer of the junction is extended, when it is reverse biased, this being irrelevant to the injection phenomenon, so that this construction is not intended to be used as a light-emitting semiconductor device. The injection electroluminescent semiconductor device according to this invention has, in the conductivity-type layer which emits the major part of light, an effective majority impurity concentration gradient, the length of which is larger than the penetration length of minority carriers, and it is substantially intended that this device increase the value of $J_{dn}/J_{rg}$ under a forward bias. Its operating principle, operating conditions, the constructional condition to which the diffusion length of minority carriers is substantially related and the resultant effect are, therefore, entirely different from the so-called hyperabrupt varactor diodes.

Another type of semiconductor device known in the art is a so-called drift-type transistor. In this device, a part of the construction is similar to that of this invention. However, in this kind of semiconductor device, it is intended to reduce the transit time of injected carriers through the base domain, and it is essentially required that, in its construction, the width of the base is much smaller than the penetration length of injectioned carriers. Hence, it should be understood that the construction of this device is substantially different from that according to the present invention, in which the thickness of the conductivity layer into which minority carriers are injected is either almost equal to or larger than the penetration length of minority carriers. Also, the effects brought about by the prior art device are entirely different from those resulting from the use of the device in accordance with the present invention.

In mixed crystal-type injection electroluminescent semiconductor devices, assuming $$E=(1/q)(dEg/dx) \qquad (7)$$

where $E_g$ represents the width of the forbidden band, the foregoing theory can be directly applied.

In this case, for the same reason as that given in the foregoing discussion, in order to obtain the remarkable effects of the present invention, when mixed crystals, such as $GaAs_{1-c}P_c$ and $Ga_{1-c}Al_cAs$, are used, it is necessary that the value of $c$ be varied by more than 0.01 for every 1 micron of separation from the junction surface.

Mixed crystal-type injection electroluminescent semiconductor devices have been reported in the art, in which the forbidden band width varies as a function of the distance from the junction surface. However, in these cases, the composition of crystals is varied depending upon its position for various reasons such as (a) to avoid any sharp variation in the lattice constant, for example, in the case of forming an epitaxial growth crystal on a substrate, (b) that from the viewpoint of the phase diagram, the composition of crystals varies inevitably along the direction of the growth of the crystal, these two reasons being mainly concerned with the formation of the crystal of (c) to enlarge the forbidden band width with increasing distance from the junction surface for the purpose of avoiding the internal absorption of light emitted near the PN-junction. Hence, such a construction has been employed only for convenience without giving any explanations as to the relationship with the injection system, and these devices have not been used as a positive method for improving the quantum efficiency of light emission in injection electroluminescent semiconductor devices.

The foregoing and other objects, features and advantages of the present invention will become apparent from the following more particular description of preferred embodiments of the invention, taken together with the accompanying drawings.

DESCRIPTION OF THE PREFERRED EMBODIMENTS AND EXAMPLES OF THE INVENTION

Example 1

Figure 1:
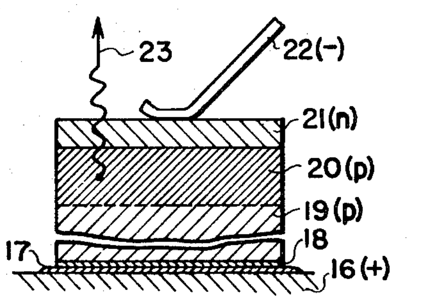
FIGS. 1, 3 and 5 show vertical sections of an electroluminescent semiconductor device in accordance with the present invention consisting of a homogenous semiconductor material.
Figure 2:
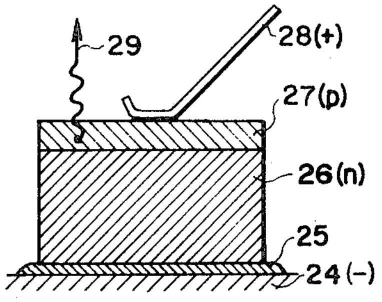
FIG. 2 PRIOR ART
FIGS. 2, 4 and 6 indicate vertical sections of conventional devices corresponding, respectively, to each of the devices shown in FIGS. 1, 3 and 5.

A sectional view of gallium arsenide injection-type electroluminescent semiconductor device fabricated by a diffusion method, using a bulk crystal having an electron diffusion length of more than 3 microns, and based on the construction according to the present invention, is shown in FIG. 1. FIG. 2 shows a sectional view of a conventional gallium arsenide injection-type electroluminescent semiconductor device.

In FIG. 1, 16 indicates a TO–18-type stem which serves as the positive electrode, 17 an alloy layer of In–Zn, 18 an alloy layer of Au–Zn (4 percent), 19 a P-type layer doped with Zn of $1\times10^{17}$ cm.$^{-3}$ as impurity, 20 a P-type layer doped with Zn having an impurity concentration distribution according to this invention, 21 an N-type layer doped with Te, 22 a gold wire serving as the negative electrode, and 23 an arrow mark indicating schematically light generated in the P-type layer 20. The concentration of Zn in the P-type layer 20 having a concentration gradient is $8\times10^{18}$ cm.$^{-3}$ at the PN-junction surface, and the same is $1\times10^{17}$ cm.$^{-3}$ on the side near the P-type layer 19. The thickness of the N-type layer is 2 microns, and the same for the P-type layer 20 having a concentration gradient is 6.5 microns. The overall height of the gallium arsenide crystal is 23 mm. In FIG. 2, 24 indicates the TO–18-type stem serving as the negative electrode, 25 a Sn layer, 26 an N-type layer uniformly doped with Te in a concentration of $8\times10^{18}$ cm.$^{-3}$ as impurity, 27 a P-type layer doped with Zn, 28 an alloy wire of Au–Zn (4 percent) serving as the positive electrode, and 29 an arrow mark indicating schematically light generated in the P-type layer 27.

A practical method for fabricating the injection electroluminescent semiconductor device having the construction according to this invention shown in FIG. 1 is described in the following.

A GaAs monocrystal wafer containing Zn of $1\times10^{17}$ cm.$^{-3}$, the diameter and thickness of which are about 10 mm. and about 0.3 mm., respectively, is polished to a mirrorlike finish. The polished wafer is 250 microns thick, and both surfaces thereof are substantially parallel. Then, the wafer is etched using a $H_2SO_4$:$H_2O_2$:$H_2O$(3:1:1) solution. The wafer is then put together with 0.5 mg. of Zn in an ampul and the ampul is evacuated. A diffusion of Zn is effected for $10^4$ seconds while maintaining the temperature of the Zn at 600° C. and that of the GaAs at 1,000° C. The part where the Zn is placed and the part for the GaAs are connected to each other with a thin tube having an inner diameter of 1 mm. in order that the vapor of As is prevented from condensing on an inner surface of the part maintained at 600° C. After completion of the diffusion process, the wafer is removed and is then etched for 1 minute using a dilute sulfuric acid solution. The wafer is then washed with water, after removing Zn on the surface. The surface, which was the upper side when the diffusion was effected, is removed to an extent of 20 microns using No. 4,000 carborundum; further removal of about 1.2 microns of surface is effected by mirror polishing. The wafer is then again etched to an extent of 1 micron using a $H_2SO_4$:$H_2O_2$:$H_2O$(3:1:1) solution. After washing with water, the wafer is placed together with 100 mg. of Te in a quartz ampul, and diffusion is effected at 1000° C. for 30 minutes. The wafer is removed after completion of the diffusion, and the surface which is opposite to the polished surface mentioned above is removed to an extent of about 100 microns using No. 4,000 carborundum. An alloy layer of AU–Zn (4 percent) is fixed to the same surface by means of evaporation, followed by sintering at 500° C. for 5 minutes. After scribing the wafer into pellets 0.5 mm. square, the evaporated Au–Zn (4 percent) layer is soldered to a TO–18-type stem using In–Zn alloy so as to make it the positive electrode. A gold wire of 100 microns is bonded to the Te diffusion surface on the upper side so as to make it the negative electrode.

Table 1 shows the extent to which the quantum efficiency of light emission is improved at a current of 10 ma. for the diode having the construction shown in FIG. 1 and fabricated by the foregoing method, as compared with the conventional injection electroluminescent semiconductor device shown in FIG. 2. The latter has the same effective majority impurity concentration as that of the former near the junction and has been fabricated under the same conditions as that of the former, i.e., after having doped the GaAs crystal with Te of $8\times10^{18}$ cm.$^{-3}$, Zn is diffused at 1,000° C. for $10^4$ seconds and then the surface is removed to an extent of 22 microns. In table 1, the quantum efficiency of light emission is calculated on the basis of the quantum efficiency of light emission measured by a silicon solar cell in an integrating sphere calibrated by using a standard electric lamp.

TABLE 1

| | Conventional construction (Fig. 2) | | Construction according to this invention (Fig. 1) | |
|---|---|---|---|---|
| Electron diffusion length* of bulk crystal used (unit:micron) | 1 | 3 | 1 | 3 |
| Penetration length of electrons into p-type layer (unit:micron) | 0.8 | 1.4 | 1.3 | 6.3 |
| Improvement ratio of the quantum efficiency of light emission** | 1 | 1 | 1.7 | 4.4 |

*Electron diffusion length in the p-type crystal in the case of uniform impurity concentration distribution.

**Relative value with respect to the quantum efficiency of light emission of the conventional injection electroluminescent semiconductor device in which the impurity concentration distribution increases with increasing distance from the junction surface. (Therefore, this value differs from the $M_E$ discussed in this application.)

Example 2

Figure 3:
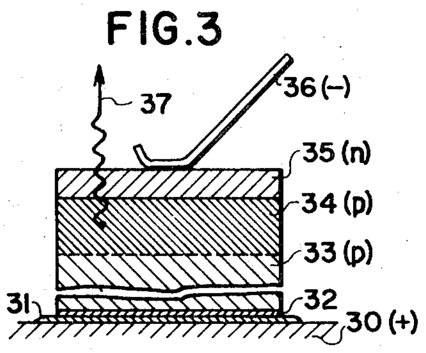
Figure 4:
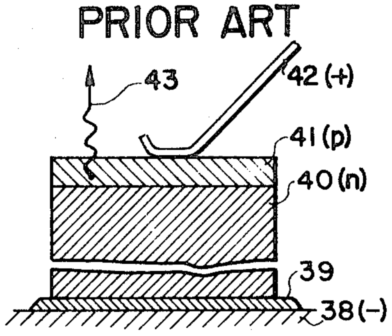
FIG. 4 PRIOR ART

FIG. 3 shows a sectional view of a gallium phosphide injection-type electroluminescent phosphide device, fabricated by a diffusion method in accordance with this invention using a bulk crystal. The electron diffusion length thereof is 3 microns. FIG. 4 shows a sectional view of a conventional gallium phosphide injection-type semiconductor device corresponding to the device shown in FIG. 3.

In FIG. 3, 30 indicates a TO–18-type stem serving as the positive electrode, 31 an alloy layer of In–Zn, 32 an alloy layer of Au–Zn (4 percent), 33 a P-type layer having a uniform impurity concentration distribution, 34 a P-type layer doped with Zn having the impurity concentration distribution according to this invention, 35 an N-type layer, 36 a gold wire serving as the negative electrode, and 37 an arrow mark indicating schematically light generated in the P-type layer 34. The concentration of Zn in the P-type layer 34 having a concentration gradient is $1\times10^{18}$ cm.$^{-3}$ at the PN-junction surface, while it is $3\times10^{16}$ cm.$^{-3}$ near the P-type layer 33 having a uniform concentration distribution. The thickness of the N-type layer 35 is 2 microns, while that of the P-type layer 34 having a concentration gradient is 6 microns. The overall height of the gallium phosphide crystal is 100 microns. In FIG. 4, 38 represents a TO–18-type stem serving as the negative electrode, 39 indicates a Sn layer, 40 an N-type layer doped uniformly with Te of $1\times10^{18}$ cm.$^{-3}$ and with O of $5\times10^{17}$ cm.$^{-3}$ as impurities, 41 a P-type layer doped with Zn, 42 an alloy layer of Au–Zn (4 percent) serving as the positive electrode, and 43 an arrow mark indicating schematically light generated in the P-type layer 41.

A practical method for fabricating the injection electroluminescent semiconductor device having the construction according to this invention as shown in FIG. 3 is as follows. A GaP crystal containing O of $5\times10^{17}$ cm.$^{-3}$ and Zn of $3\times10^{16}$ cm.$^{-3}$ as impurities is prepared by a liquid phase growth method using a Ga solution obtained with GaP multicrystals, $Ga_2O_3$ and Zn. The crystal is divided into wafers 5 mm. square by scribing. A GaP crystal wafer obtained in this manner is polished to a mirror finish in a manner such that the polished wafer is about 110$\mu$ thick and both surfaces thereof are substantially parallel. The wafer is then etched for 1 minute using aqua regia and is washed with water. It is then put together with 2 mg. of Zn in a quartz ampul having a capacity of about 20 cc., and the ampul is evacuated. A diffusion process is then effected for 1 hour at a temperature of 800° C. after completion of the diffusion, the wafer is removed and is etched for 3 minutes using dilute hydrochloric acid in order to remove Zn from the surface. It is then washed with water. One side of the water is removed (hereinafter referred to as surface A in embodiment 2) to an extent of 5 microns using No. 4,000 carborundum. An additional 15 microns of the same is removed by means of mirror polishing. The wafer is then etched again for 15 minutes using aqua regia so as to etch off the surface A by about 1 micron. Thereafter, a Au–Zn (4 percent) layer is deposited by evaporation on the surface opposite to surface A. The wafer is then sintered for 5 minutes in an atmosphere of $H_2$ gas at a temperature of 500° C. It is scribed into pellets of 0.5 mm. square. A Sn grain is put on the surface A under a $H_2$ atmosphere so as to produce an alloy junction. The wafer is dipped in a $HF:H_2O_2(1:1)$ solution in order to remove any remaining Sn. The Au–Zn (4 percent) surface is then soldered to a TO–18-type stem using a small amount of In–Zn alloy so as to make it the positive electrode. Finally, a Au wire of 100 microns $\phi$ is bonded to the surface A so as to make it the negative electrode.

Table 2 shows the extent to which the quantum efficiency of light emission is improved at a current of 10 ma. for the diode having the construction shown in FIG. 3 and fabricated by means of the foregoing method, as compared with the conventional injection electroluminescent semiconductor device shown in FIG. 3 which has the same effective majority impurity concentration ($1\times10^{18}$ cm.$^{-3}$) as that of the former near the junction and which has been fabricated under the same conditions as those used for the former (i.e., by diffusion of Zn for 1 hour at 800° C.). In table 2, the quantum efficiency of light emission is calculated on the basis of the quantum efficiency of light emission measured by a silicon solar cell in an integrating sphere calibrated by using a standard electric lamp.

TABLE 2

| | Conventional construction (Fig. 4) | | Construction according to this invention (Fig. 3) | |
|---|---|---|---|---|
| Electron diffusion length* of bulk crystal used (unit:micron) | 1 | 3 | 1 | 3 |
| Penetration length of electrons into p-type layer (unit:micron) | 0.7 | 1.2 | 1.3 | 7.2 |
| Improvement ratio of quantum efficiency of light emission** | 1 | 1 | 1.8 | 5.9 |

*Electron diffusion length in p-type crystal in the case of the uniform impurity concentration distribution.

**Relative value with respect to the quantum efficiency of light emission of the conventional injection electroluminescent semiconductor device in which the impurity concentration distribution increases with increasing distance from the junction surface. Therefore, this value differs from the $M_E$ discussed in this specification.

In this embodiment, the impurity concentration of O is $5\times10^{17}$ cm.$^{-3}$. As is well known, emitted light for this impurity concentration is red. For impurity concentrations of O of less than $10^{16}$ cm.$^{-3}$, the emitted light is green. For impurity concentrations of O of more than $10^{16}$ cm.$^{-3}$, the electron diffusion length may be of the order of 10 microns, and for impurity concentrations of less than $10^{16}$ cm.$^{-3}$ the electron diffusion length tends to be of the order of several microns.

Example 3

Figure 5:
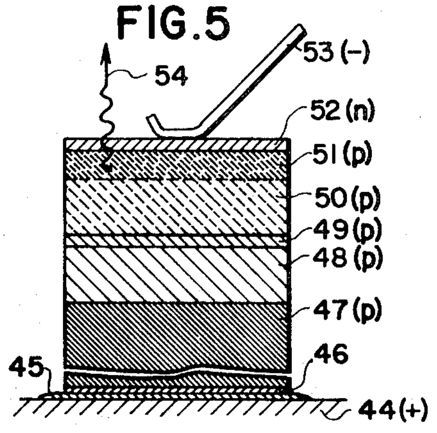
Figure 6:
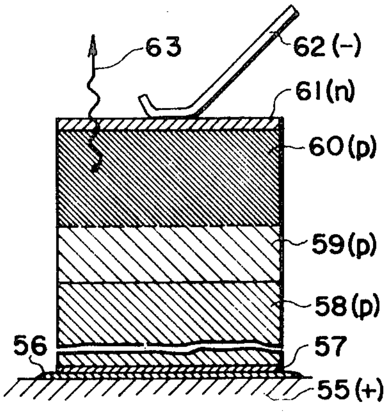
FIG. 6 PRIOR ART
Figure 7:
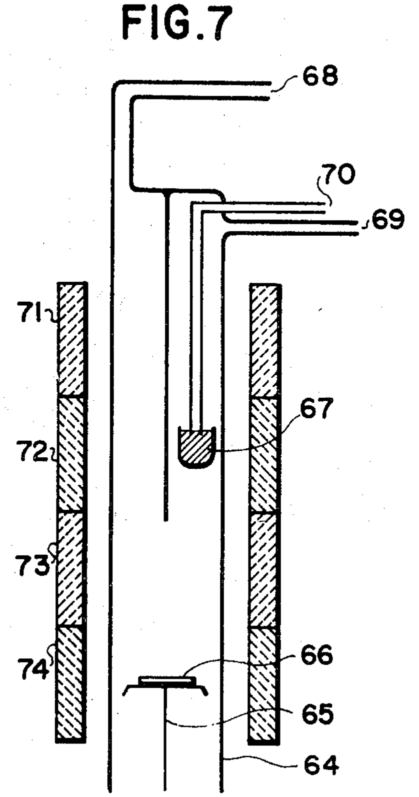
FIG. 7 is a vertical section of equipment to be used in the production of semiconductor devices according to this invention.

FIG. 5 shows a sectional view of a $GaAs_{0.6}P_{0.4}$ injection-type electroluminescent semiconductor device, fabricated by means of a vapor growth junction method in accordance with this invention by using a bulk crystal. The electron diffusion length thereof is 3 microns. FIG. 6 shows a sectional view of a conventional $GaAs_{0.6}P_{0.4}$ injection-type electroluminescent semiconductor device corresponding to that of FIG. 5. FIG. 7 shows an apparatus for the fabrication of the $GaAs_{0.6}P_{0.4}$ injection-type electroluminescent semiconductor device according to this invention and shown in FIG. 5.

In FIG. 5, 44 indicates a TO–18-type stem serving as the positive electrode, 45 shows an In–Zn alloy layer, 46 a Au–Zn (4 percent) alloy layer, 47 a Ga substrate, 48 a GaAsP layer in which the P increases gradually from the substrate 47 towards the other end while the As varies inversely to the former, 49 a $GaAs_{0.6}P_{0.4}$ layer having a uniform concentration distribution of Zn as impurity, 50 a $GaAs_{0.6}P_{0.4}$ layer having a lower uniform concentration of Zn than that of 49 as impurity, 51 a $GaAs_{0.6}P_{0.4}$ layer having an impurity concentration distribution according to this invention, 52 an N-type layer of $GaAs_{0.6}P_{0.4}$ doped with Se, 53 a gold wire serving as the negative electrode, and 54 an arrow mark to indicate schematically the light generated in the P-type layer 51. The thicknesses of the layers 47, 48, 49, 50, 51 and 52 are 140, 20, 4, 20, 10 and 4 microns, respectively. All of the layers 47, 48, 49, 50 and 51 are P-type layers having Zn acceptors, and the impurity concentration of Zn in the layers 47, 48 and 49 is $1\times10^{18}$ cm.$^{-3}$. The impurity concentration of Zn in the layer 50 is $5\times10^{16}$ cm.$^{-3}$, is $5\times10^{16}$ cm.$^{-3}$ in the layer 51 near the layer 50 and is $1\times10^{18}$ cm.$^{-3}$ near the N-type layer 52. The layer 52 is an N-type layer of Se donor and its impurity concentration is $2\times10^{18}$ cm.$^{-3}$.

In FIG. 6, 55 indicates a TO–18-type stem serving as the positive electrode, 56 indicates an In–Zn alloy layer, 57 a Au–Zn (4 percent) alloy layer, 58 a GaAs substrate, 59 a P-type GaAsP layer in which the content of P increases gradually from the substrate 58 towards the other end while the content of As varies inversely to the former, 60 a P-type layer of $GaAs_{0.6}P_{0.4}$, 61 an N-type layer of $GaAs_{0.6}P_{0.4}$, 62 a gold wire serving as the negative electrode, and 63 an arrow mark indicating schematically light generated in the P-type layer 60. The thicknesses of the layers 58, 59, 60 and 61 are 140, 20, 54 and 4 microns, respectively. The layers 58, 59 and 60 are P-type layers having a uniform acceptor Zn concentration of $1\times10^{18}$ cm.$^{-3}$. The layer 61 is an N-type layer of Se donor having a concentration of $2\times10^{18}$ cm.$^{-3}$.

In FIG. 7, 64 indicates a quartz tube, 65 indicates a sample holder, 66 is a gallium arsenide substrate, 67 is a Ga source, numerals 68, 69 and 70 indicate the inlets for ($PH_3$+$AsH_3$+$H_2$+ dopant) gas, ($H_2$) gas and ($H_2$+HCl) gas, respectively, and numerals 71, 72, 73 and 74 are electric furnaces. The quartz tube 64 has a diameter of about 80 mm. and a length of about 1,500 mm.

A practical method for fabricating the injection-type luminescent semiconductor device having the construction according to this invention and as shown in FIG. 5 is as follows.

A P-type GaAs wafer containing Zn in a concentration of about $3\times10^{17}$ cm.$^{-3}$ as impurity is polished to a mirrorlike finish. The diameter and the thickness of the wafer are about 20 mm. and about 0.5 mm., respectively. The wafer is etched for 30 seconds at a temperature of 60° C. using a $H_2SO_4$:$H_2O_2$:$H_2O$(3:1:1) solution. The wafer is placed, keeping its [100] surface on the upper side, in an apparatus as shown in FIG. 7. As can be seen from FIG. 7, after permitting argon gas to flow from the gas inlets 68, 69 and 70, the flow of gas is changed to $H_2$ gas at a flow rate of 1 liter/minute. The temperature of the electric furnaces is adjusted so as to keep elements 71 and 72 at a temperature of 800° C., element 73 at 925° C. and element 74 at 825° C. Then, $AsH_3$+$PH_3$ gas is added at a flow rate of about 15 cc./minute to the $H_2$ gas flowing from gas inlet 68 (hereinafter, in the embodiment 3, the ratio of As to P will be represented by $y$. At the beginning, $y$X0 and $y$ increases gradually afterwards.). $H_2$ gas is added to gas inlet 69, said gas having been passed through $(C_2H_5)_2$ Zn maintained at a temperature of −25° C., at a flow rate of 40 cc./minute, while to gas inlet 70, HCl gas is added at a flow rate of 15 cc./minute. In this case as well as in the following, the flow rate of $H_2$ gas at each of the gas inlets 68, 69 and 70 varies properly. However, the total flow rate of $H_2$ gas is maintained at 1 liter/minute at all times. For the gas flow from the gas inlet 68, $y$ is varied continuously from 0 to 0.45. When $y$ reaches 0.45, the gas flow is maintained unchanged for 10 minutes. Then, the flow rate of $H_2$ gas passing through the $(C_2H_5)_2$ Zn is reduced to 15 cc./minute and this gas flow is continued for 50 minutes. Thereafter, the flow rate of $H_2$ gas is continuously increased from 15 cc./minute to 40 cc./minute in 25 minutes. Then, the gas flow is changed from $H_2$ gas passing through $(C_2H_5)_2Zn$ to $H_2$ gas containing $H_2Se$ gas of over 100 p.p.m. flowing at a rate of 100 cc./minute and continuing for 10 minutes.

Figure 9:
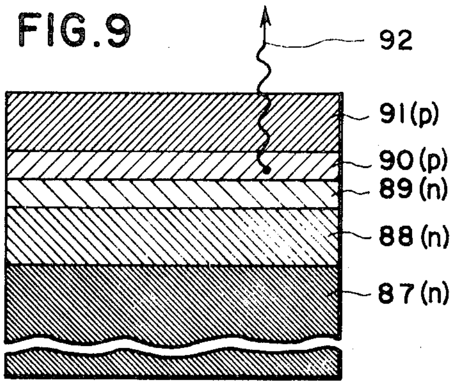
FIGS. 9 and 11 indicate vertical sections of conventional devices corresponding, respectively, toe each of the devices shown in FIGS. 8 and 10.

The substrate side of the wafer is polished with No. 4,000 carborundum to give a wafer of 200 microns thickness. Then, a Au–Zn (4 percent alloy layer is fixed thereto by means of evaporation, and the wafer is sintered in a $H_2$ atmosphere for 5 minutes at a temperature of 500° C. It is scribed into square pellets having a dimension of 0.5 mm., and the evaporated surface thereof is bonded to a TO–18-stem so as to make it the positive electrode. Finally, a gold wire of 100 microns $\phi$ is bonded to the opposite side (vapor growth layer) so as to make it the negative electrode. The conventional construction of the semiconductor device shown in FIG. 9, is fabricated by keeping the flow rate of $H_2$ gas passing through the $(C_2H_5)_2$ Zn at a constant rate of 40 cc./minute.

Table 3 shows the improvement in quantum efficiency of light emission at a current of 10 ma. for the diode having the construction shown in FIG. 5 and fabricated by the foregoing method, as compared with the conventional injection electroluminescent semiconductor device shown in FIG. 6. In table 3, the quantum efficiency of light emission is determined in the same manner as those in examples 1 and 2. As is obvious from the foregoing description and the described embodiments, the quantum efficiency of light emission in the light-emitting conductivity-type layer of the injection-type electroluminescent semiconductor device in accordance with the present invention can be increased by several 10s of percent up to 10 times, in comparison with those devices where the impurity concentration distribution is constant, by decreasing the concentration of the effective majority impurity with increasing distance from the junction. On the contrary, like injection-type electroluminescent semiconductor devices fabricated by the conventional diffusion method, where the effective majority impurity concentration in the light-emitting conductivity-type layer increases with increasing distance from the junction, the quantum efficiency of light emission is smaller than those devices where the impurity concentration distribution is constant.

TABLE 3

| | Conventional construction (Fig. 6) | | | Construction according to this invention (Fig. 5) | | |
|---|---|---|---|---|---|---|
| Electron diffusion length of bulk crystal used (unit: micron) | 1 | 3 | 6 | 1 | 3 | 6 |
| Penetration length* of electrons into p-type layer (unit: micron) | 1 | 3 | 6 | 1.2 | 4.7 | 13.2 |
| Improvement ratio or quantum efficiency of light emission (unit: micron) | 1 | 1 | 1 | 1.2 | 1.6 | 2.2 |

*The diffusion length of electrons in a p-type crystal in the case of a uniform impurity concentration distribution.

With increasing gradient of the impurity concentration, the intensity of the internal electric field in the light-emitting conductivity-type layer and the diffusion lengths of injected minority carriers in the layer become greater, and therefore the above-mentioned effects become more eminent. The quantum efficiency of light emission also depends upon the lattice defects near the junction. In order to make the effects of this invention even more remarkable, it is necessary to provide an effective majority impurity concentration gradient where the impurity concentration is reduced to less than a half by every depth corresponding to the penetration length of injected minority carriers.

Example 4

Figure 8:
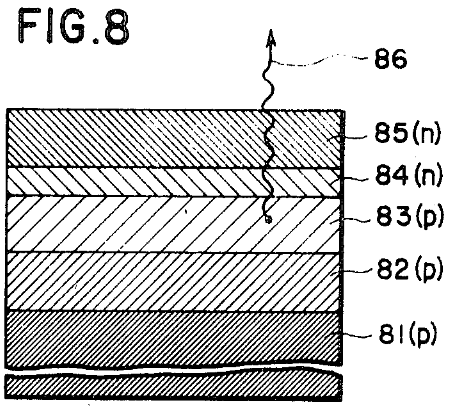
FIGS. 8 and 10 show vertical sections of a mixed crystal-type electroluminescent semiconductor device in accordance with this invention.

FIG. 8 shows a sectional view of a $GaAs_{1-c}P_c$ injection electroluminescent semiconductor device fabricated by a vapor phase deposition method in accordance with this invention using a bulk crystal. The electron diffusion length thereof is 3 microns. FIG. 9 shows a sectional view of a conventional $GaAs_{1-c}PBc$ injection electroluminescent semiconductor device corresponding to the device in FIG. 8.

In FIG. 8, 81 is a P-type GaAs substrate, 82 is a $GaAs_{1-c}P_c$ layer where $c$ increases from 0 to 0.30, 83 is a layer where $c$ increases from 0.30 to 0.40, 84 is a layer where $c$ increases from 0.40 to 0.45, and 85 is a layer where $c$ increases from 0.45 to 0.50. The thicknesses of the layers 81, 82, 83, 84 and 85, are, respectively, 300$\mu$, 10$\mu$, 10$\mu$, 5$\mu$ and 10$\mu$. The layers 81, 82 and 83 are of the P-type containing Zn as acceptor; the concentrations thereof are, respectively, $5\times10^{18}$ cm.$^{-3}$, $5\times10^{18}$ cm.$^{-3}$ and $10^{17}$ cm.$^{-3}$. The layers 84 and 85 are N-type layers containing Te as donors, the concentrations thereof being, respectively, $10^{17}$ cm.$^{-3}$ and $10^{19}$ cm.$^{-3}$. Numeral 86 is an arrow mark showing schematically light generated in the layer 83.

FIG. 9 is a sectional view of a conventional $GaAs_{1-c}P_c$ injection electroluminescent semiconductor device. Numeral 87 in FIG. 9 designates an N-type GaAs substrate, 88 is a $GaAs_{1-c}P_c$ layer where $c$ increases from 0 to 0.40, 89 is an N-type layer where $c$ is constant, 90 is a P-type layer where $c$ is constant, and 91 is a layer where $c$ increases from 0.40 to 0.50. The thicknesses of the layers 87, 88, 89, 90 and 91 are, respectively, 300 $\mu$, 10 $\mu$, 5 $\mu$, 5 $\mu$ and 10 $\mu$. The layers 87, 88 and 89 are N-type layers containing Te as donor, the concentrations thereof being, respectively, $5\times10^{18}$ cm.$^{-3}$, $5\times10^{18}$ cm.$^{-3}$ and $10^{17}$ cm.$^{-3}$. The layers 90 and 91 are P-type layers containing Zn as acceptor, the concentrations thereof all being $10^{19}$ cm.$^{-3}$. Numeral 92 is an arrow mark showing schematically light generated in the P-type layer 90. The injection electroluminescent semiconductor device shown in FIG. 8 can be fabricated in the same way as the conventional injection electroluminescent semiconductor device shown in FIG. 9 by means of a vapor phase deposition method on a GaAs substrate using $AsCl_3$ and $PCl_3$ or $AsH_3$ and $PH_3$, requiring no special fabrication process. An example of the fabrication thereof is described in the following.

A [100] surface of a P-type GaAs wafer, the diameter and thickness of which are about 10 mm. and 0.5 mm., respectively, is mirror polished. The impurity concentration thereof is $5\times10^{18}$ cm.$^{-3}$. The surface of the wafer is treated with an acid solution, and the wafer is placed, together with a Ga source, in a quartz tube having a diameter of about 40 mm. with the mirror-polished surface facing upward. The Ga source and the GaAs substrate are heated at 1,000° and at 800° C., respectively, in a $H_2$ gas flow at 20 cm./sec. containing $AsCl_3$ gas of a partial pressure of about $10^{-2}$ atoms. After starting to mix $PCl_3$ into the gas flow, the molar ratio of $PCl_3$ and $AsCl_3$ (hereinafter referred to as M herein) is continuously increased from 0 to 0.35 in 1 hour. Between 1 hour and 2.30 hours after starting to mix the $PCl_3$ gas into the gas flow, M is continuously increased linearly with respect to the time from 0.35 to 0.45. In the last 30 minutes Te is added to the gas flow. The Te may be either in the from of $TeH_2$ or of gas obtained by heating Te or $TeCl_2$. The layers 82 and 83 are converted to P-type layers by autodoping. Between 2.30 hours to 3.30 hours, M is continuously increased from 0.45 to 0.60. During this time, the partial pressure of the Te gas is sufficiently increased. The back surface of the wafer, that is, the GaAs substrate side of the wafer is lapped off by about 200 $\mu$ using No. 4,000 carborundum. A Au-Zn (4 percent) alloy layer is fixed thereon by evaporation, and the wafer is sintered for 5 minutes at 500° C. in a $H_2$ atmosphere. It is then scribed into pellets 0.5 mm. square and its evaporated surface is bonded to a stem with a small quantity of In-Zn alloy, in order to form the positive electrode. Finally, a 100 $\mu$ diameter gold wire is welded with pressure to the opposite side, i.e., the N-type layer side so as to make it the negative electrode.

Table 4 shows how much the quantum efficiency of light emission is improved for the diode having the construction shown in FIG. 8 and fabricated by the foregoing method using bulk crystals for which the electron diffusion lengths in the P-type layers are 1,3 and 10 microns, as compared with the conventional injection electroluminescent semiconductor device shown in FIG. 9.

TABLE 4

| | | | |
|---|---|---|---|
| Electron diffusion length $L_n$ (unit:micron) | 1 | 3 | 10 |
| $qEL_n/kT$ | −0.52 | −1.56 | −5.6 |
| Penetration length of electrons $M_EL_n$ (unit:micron) | 1.3 | 6.1 | 5.4 |
| Improvement ratio of quantum efficiency of light emission $M_E$ | 1.29 | 2.05 | 5.39 |

Example 5

Figure 10:
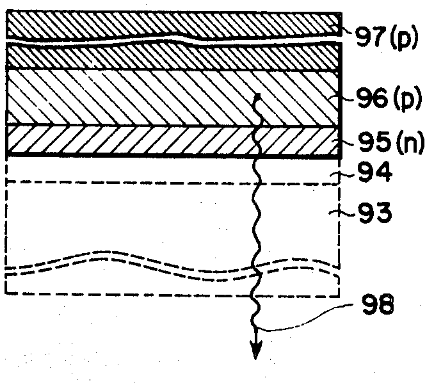
Figure 11:
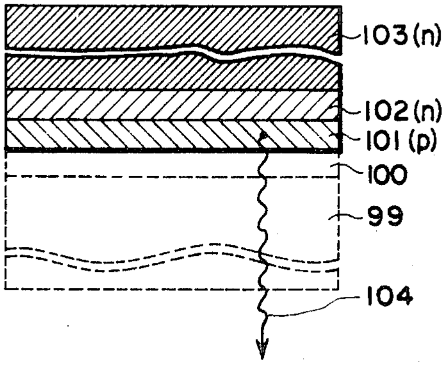

FIG. 10 shows a sectional view of a $Ga_{1-c}Al_cAs$ injection electroluminescent semiconductor device fabricated by a liquid phase deposition method in accordance with this invention using a bulk crystal. The electron diffusion length of the bulk crystal is 3 microns. FIG. 11 shows a sectional view of a $Ga_{1-c}AlAs$ injection electroluminescent semiconductor device corresponding to that of FIG. 10.

In FIG. 10, 93 represents a GaAs substrate, 94 a $Ga_{1-c}Al_cAs$ layer where $c$ gradually decreases from 0.45 to 0.40, 95 a layer where $c$ gradually decreases from 0.40 to 0.35, 96 a layer where $c$ gradually decreases from 0.35 to 0.25, and 97 a layer where $c$ gradually decreases from 0.25 to 0.10. The layers 93 and 94 are removed after completion of the liquid phase deposition and before electrode welding. The thicknesses of layers 95, 96 and 97 are, respectively, 5 $\mu$, 10 $\mu$, and 100 $\mu$. The layer 95 is an N-type layer containing Te as donors, the concentration thereof being $10^{18}$ cm.$^{-3}$. The layers 96 and 97 are P-type layers containing Zn as acceptors, the concentrations of which are both $10^{18}$ cm.$^{-3}$. Numeral 98 represents an arrow mark showing schematically the light generated in the P-type layer 95.

FIG. 11 is a sectional view of a conventional $Ga_{1-c}Al_cAs$ injection electroluminescent semiconductor device. In FIG. 11, 99 is a GaAs substrate, 100 is a $Ga_{1-c}Al_cAs$ layer where $c$ gradually increases from 0 to 0.40, 101 is a layer where $c$ gradually decreases from 0.40 to 0.35, 102 is a layer where $c$ gradually decreases from 0.35 to 0.30, and 103 is a layer where $c$ gradually decreases from 0.30 to 0.10.

The layers 99 and 100 are removed after completion of the liquid phase deposition and before electrode welding. The thicknesses of the layers 101, 102 and 103 are, respectively, 5 $\mu$, 5 $\mu$ and 100 $\mu$. The layer 101 is a P-type layer containing Zn as acceptors, the concentration of which is $10^{18}$ cm.$^{-3}$. The layers 102 and 103 are N-type layers containing Te as donors, the concentrations of which are both $10^{18}$ cm.$^{-3}$. Numeral 104 is an arrow mark showing schematically light generated in the P-type layer 101.

The injection electroluminescent semiconductor device, the sectional view of which is shown in FIG. 10, is fabricated in the same way as that shown in FIG. 11. Namely, a small quantity of Al of $3\times10^{-3}$ weight ratio is added to a Ga solution saturated with GaAs at 1,000° C. A substrate is immersed in the solution, which is cooled to about 800° C. at a speed of about 10° C./hour. During the cooling, Zn is added to the solution at a temperature of 980° C. so as to have a PN-junction in the thus-obtained crystal.

Table 5 shows the extent to which the quantum efficiency of light emission is improved for the diode according to this invention where the layers 93 and 94 are removed so as to take out light generated in the P-type layer 96 through the surface which was adjacent to the removed layers, as shown in FIG. 10, using bulk crystals for which the electron diffusion lengths in the P-type layers are 1, 3 and 10 microns, as compared with the conventional injection electroluminescent semiconductor device shown in FIG. 11.

TABLE 5

| | | | |
|---|---|---|---|
| Electron diffusion length $L_n$ (unit:micron) | 1 | 3 | 10 |
| $qEL_n/kT$ | −0.56 | −1.68 | −5.6 |
| Penetration length of electrons $M_E L_n$ (unit:micron) | 1.3 | 6.4 | 5.8 |
| Improvement ratio of quantum efficiency of light emission $M_E$ | 1.74 | 4.63 | 33.3 |

As it is evident from the above description and the described practical embodiments, the quantum efficiency of light emission in the light-emitting conductivity-type layer of the injection-type electroluminescent mixed crystal semiconductor device is improved by the construction in accordance with the present invention, where the component having a greater forbidden band width is reduced with the increase of the distance from the PN-junction The larger the diffusion length of injected minority carriers, the more marked is the improvement of this invention. In comparison with conventional injection electroluminescent mixed crystal semiconductor devices, where light is taken out through the light-emitting conductivity-type layer having a wider forbidden band with the increase of the distance from the PN-junction the quantum efficiency of light emission can be increased by a factor of several 10s.

The invention being thus described, it will be obvious that the same may be varied in many ways. Such variations are not to be regarded as a departure from the spirit and scope of the invention, and all such modifications as would be obvious to one skilled in the art are intended to be included herein.

What is claimed is:

1. An injection electroluminescent semiconductor device comprising a P-type semiconductor layer and an N-type semiconductor layer in conjunction with each other to form a PN-junction, at least one of said different conductivity-type semiconductor layers being light emissive and thicker than the penetration length of injected minority carriers under a forward bias, said light-emissive layer having means producing an internal electric field which keeps said injected minority carriers away from the PN-junction, at least partially in the region thereof up to the penetration length of injected minority carriers from said PN-junction, and electrodes provided to said layers in order to apply a voltage in the forward direction to said PN-junction.

2. An injection electroluminescent semiconductor device according to claim 1, wherein said light-emissive layer has a distribution of effective majority impurity concentration which decreases with the increase of the distance from said PN-junction, thereby forming said internal electric field.

3. An injection electroluminescent semiconductor device according to claim 2, wherein said distribution of effective majority impurity concentration decreasing with the increase of the distance from said PN-junction toward the surface opposite thereto increases again in the vicinity of said surface opposite to said PN-junction.

4. An injection electroluminescent semiconductor device according to claim 2, wherein said distribution of effective majority impurity concentration decreases at least to half by every diffusion length of injected minority carriers.

5. An injection electroluminescent semiconductor device according to claim 4, wherein said semiconductor layers are made of a material selected from the group consisting of GaAs $GaAs_{1-c}PBc$($0<c<0.45$) and $Ga_{1-c}Al_cAs$ ($0<c<0.45$).

6. An injection electroluminescent semiconductor device according to claim 5, wherein said distribution of effective majority impurity concentration decreases at least to half by every 1 $\mu$ of separation from said PN-junction.

7. An injection electroluminescent semiconductor device according to claim 4, wherein said semiconductor layers are made of GaP bulk crystal including oxygen atoms of not more than $10^{16}$ cm.$^{-3}$ as impurity, whereby said semiconductor device emits green light under a forward bias.

8. An injection electroluminescent semiconductor device according to claim 7, wherein said distribution of effective majority impurity concentration decreases at least to half by every 1 $\mu$ of separation from said PN-junction.

9. An injection electroluminescent semiconductor device according to claim 4, wherein said semiconductor layers are made of GaP bulk crystal including oxygen atoms of not less than $10^{16}$ cm.$^{-3}$ impurity, whereby said semiconductor device emits red light under a forward bias.

10. An injection electroluminescent semiconductor device according to claim 9, wherein said distribution of effective majority impurity concentration decreases at least to half by every 1 $\mu$ of separation from said PN-junction.

11. An injection electroluminescent semiconductor device according to claim 1, wherein the maximum effective majority impurity concentration in said light-emissive layer in the vicinity of said PN-junction is not less than $10^{16}$ cm.$^{-3}$.

12. An injection electroluminescent semiconductor device according to claim 2, wherein the maximum effective majority impurity concentration in said light-emissive layer in the vicinity of the PN-junction is not less than $10^{16}$ cm.$^{-3}$.

13. An injection electroluminescent semiconductor device according to claim 2, wherein said distribution of effective majority impurity concentration decreases linearly with respect to the distance from the PN junction at a rate greater than $10^{20}$ cm.$^{-4}$.

14. An injection electroluminescent semiconductor device according to claim 1, wherein said light-emissive layer is a P-type layer.

15. An injection electroluminescent semiconductor device according to claim 2, wherein said light-emissive layer is a P-type layer.

16. An injection electroluminescent semiconductor device according to claim 13, wherein said device is made of a semiconductor material selected from the group consisting of GaAs GaP, $GaAs_{1-c}P_c$($0<c<0.45$) and $Ga_{1-c}Al_cAs$ ($0<c<0.45$).

17. An injection electroluminescent semiconductor device according to claim 1, wherein said device is made of a mixed crystal semiconductor material and said internal electric field is formed by reducing the content of the component having a wider forbidden band with the increase of the distance from said PN-junction.

18. An injection electroluminescent semiconductor device according to claim 17, wherein said light-emissive layer is a P-type layer.

19. An injection electroluminescent semiconductor device according to claim 17, wherein the conductivity-type layer other than said light emissive layer has a forbidden band width larger than the energy of light generated at the PN-junction.

20. An injection electroluminescent semiconductor device according to claim 17, wherein said semiconductor layers are made of a bulk crystal selected from the group consisting of $GaAs_{1-c}PBc$($0<c<0.45$) and $Ga_{1-c}Al_cAs$ ($0<c<0.45$).

21. An injection electroluminescent semiconductor device according to claim 20, wherein one of the light-emissive layers has a portion in which $c$ is reduced with the increase of the distance from said PN-junction.

22. An injection electroluminescent semiconductor device according to claim 21, wherein $c$ decreases at least at a rate of not less than $0.01/\mu$ with the increase of the distance from said PN-junction.

* * * * *